(12) United States Patent
Mönch et al.

(10) Patent No.: US 7,577,318 B2
(45) Date of Patent: Aug. 18, 2009

(54) WAVELENGTH CONVERSION LAYERS WITH EMBEDDED CRYSTALLITES

(75) Inventors: Holger Mönch, Vaals (NL); Gero Heusler, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/722,812

(22) PCT Filed: Dec. 19, 2005

(86) PCT No.: PCT/IB2005/054302

§ 371 (c)(1),
(2), (4) Date: Jun. 26, 2007

(87) PCT Pub. No.: WO2006/072849

PCT Pub. Date: Jul. 13, 2006

(65) Prior Publication Data

US 2008/0094691 A1    Apr. 24, 2008

(30) Foreign Application Priority Data

Jan. 4, 2005    (EP)    ................................. 05100016

(51) Int. Cl.
*G02F 1/23*    (2006.01)
*G02F 1/35*    (2006.01)

(52) U.S. Cl. ......................................... 385/1; 359/332

(58) Field of Classification Search .................. 385/1
See application file for complete search history.

(56) References Cited

U.S. PATENT DOCUMENTS

| | | | |
|---|---|---|---|
| 5,524,011 A | 6/1996 | Lawandy | |
| 5,786,102 A | 7/1998 | Paz-Pujalt et al. | |
| 6,344,261 B1 | 2/2002 | Kaule et al. | |
| 6,995,371 B2 * | 2/2006 | Garber et al. | ................ 250/330 |

(Continued)

FOREIGN PATENT DOCUMENTS

GB    2289137 A    11/1995

(Continued)

OTHER PUBLICATIONS

MacDonald R. L; Tensor Properties of Optically Encoded-Harmonic Generation in Semiconductor-Microcrystallite-Doped Glasses, Electronics Letters, vol. 27, No. 25, Dec. 05, 1991, pp. 2331-2332, XP002382687.

(Continued)

*Primary Examiner*—Jerry T Rahll

(57) ABSTRACT

The present invention is directed to a wavelength conversion layer (1) with a matrix layer (2) comprising embedded rare-earth-ion-doped micro-crystallites (3) and/or rare-earth-ion-doped amorphous particles, wherein said rare-earth-ion-doped micro crystallites and/or rare-earth-ion-doped amorphous particles are doped with at least one of the lanthanides, and wherein said rare-earth-ion-doped micro-crystallites and/or said doped amorphous particles have a mean diameter $d_{50}$ of 10 nm to 500 müm, and wherein the matrix layer, is transparent, whereby the refractive indices of said rare-earth-ion-doped micro-crystallites and/or said rare-earth-ion-doped amorphous particles match the refractive indices of the matrix layer with an index fifference delta n such as: $0 < \_delta\ n < \_0.1$, for at least one wavelength in the range of 400 nm to 1200 nm.

10 Claims, 3 Drawing Sheets

U.S. PATENT DOCUMENTS

Figure 1:
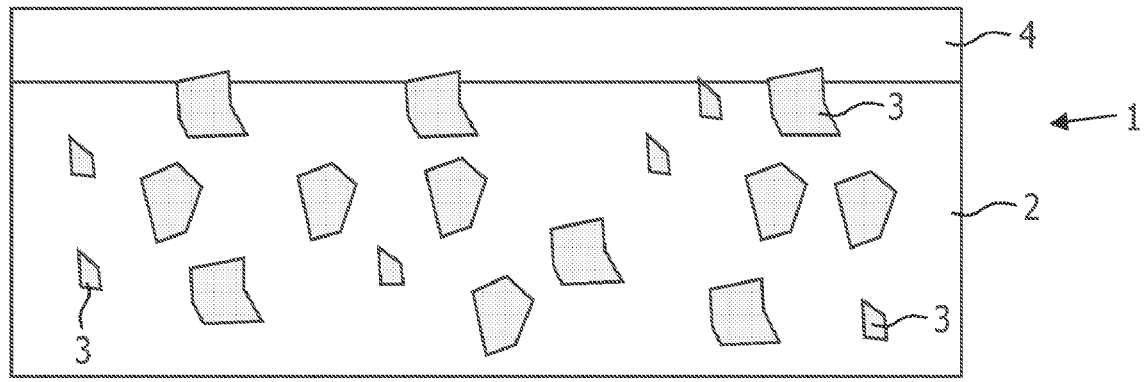

2002/0035755 A1  3/2002  Widdemer
2007/0019691 A1  1/2007  Monch et al.

FOREIGN PATENT DOCUMENTS

JP          09086958 A    3/1997
JP          2001021885 A  1/2001

OTHER PUBLICATIONS

Lawandy N. M. Et Al: Optically Encoded Phase-Matched Second-Harmonic Generation in Semiconductor-Microcrystallite-Doped Glasses, Journal of the Optical Society of America B, vol. 8, No. 6, Jun. 1991, pp. 1307-1314, XP002382688.

E. M. Dianov, Et Al; Evidence for Different Photovoltaic Mechanisms of Photoinduced Second-Harmonic Generation in Semiconductor Microcrystallite-Doped and Lead Glass, Spie vo. 2044, Aug. 18, 1998, pp. 11-17, XP002382686.

XIA0B0 Chen, Et Al: Oxyfluoride Vitroceramics Material and Upconversion Luminescence Emhancement of Er<3 +>ion Spie, vol. 4221, Nov. 08, 2000, pp. 88-92, XP002382685.

Siguo Xiao, Et Al: Up-Conversion in Er3+Y2O3 Nanocrystals Pumped at 808 nm, J. Appl. Phys. vol. 96, No. 3, Aug. 1, 2004, pp. 1360-1364, XP012068536.

Matsuura Daisuke: Red, Green and Blue Upconversion Luminescence of Trivalent-Rare-Earth ion-Doped Y2O3 Nanocrystals, J. Appl. Phys. vol. 81, No. 24, Dec. 9, 2002, pp.4526-4528, XP012032738, ISSN.

Nayfeh M H Et Al: Second Harmonic Generation in Microcrystallite Films of Ultrasmall Si Nanoparticles, Appl. Phys. AIP, vol. 77. No. 25, Dec. 18, 2000, pp. 4086-4088, XP012026923, ISSN.

J. Hulliger Et Al; "Waveguides in YLF Grown by Liquid-Phase Epitaxy", Laser Physics, vol. 8, No. 3, 1998, pp. 764-768, Dept. Of Chemistry & Biochemistry, Univ. Of Berne, Berne, Switzerland.

William P. Risk, Et Al: 8.3 Upconversion Lasers, Compact Blue-Green Lasers, Cambridge Univ. Press 2003, pp. 427-436.

William P. Risk, Et Al: 8 Upconversion Lasers, Compact Blue-Green Lasers, Cambridge Univ., Press 2003, pp. 385-397.

Kuck Et Al: "The Art of Crystal Growth"; Festkorperlaser, Physikalische Blatter 57 (2001), NR. 10, TRANSLATION.

* cited by examiner

WAVELENGTH CONVERSION LAYERS WITH EMBEDDED CRYSTALLITES

The present invention concerns a wavelength conversion layer with embedded crystallites, a semiconductor light source containing said wavelength conversion layer as well as a system containing at least one of said semiconductor light source.

Wavelength conversion is an important technology to generate for example white light from semiconductor light sources. Examples are the combination of micro-crystalline phosphors with blue-violet LEDs or the up-conversion of IR laser radiation in rare earth doped fluoride crystallites and glasses to realize a laser in the visible wavelength range. Visible light emitting phosphor layers are general known in prior art and commonly used in fluorescent lamps or cathode ray television tubes. Such known visible light emitting phosphor layers are also used to convert blue or violet light of an InGaN LED into visible radiation of other wavelengths, e.g. green or yellow.

In general, visible light emitting phosphor layers consist of rare earth doped micro crystallites, which are sintered or obtained by other crystal growth processes. Such a layer scatters the light due to the many transitions inside and outside said crystalline material. Therefore, the light emission pattern of a prior art phosphor layer is isotropic. Further, the energy density of the fluorescent radiation is much lower than that used for the excitation. Thus, said prior art phosphor layers cannot be suitable used for highly demanding optical applications. Further, said prior art phosphor layers cannot be suitable used for lasers. Thus, on one hand phosphor powders can be prepared relatively easy but on the other hand do not have the desired optical performance. Also, sintering or crystal growth processes of phosphor powders are complex, time- and/or energy consuming.

These and other aspects of the invention will be apparent from and elucidated with reference to the embodiments described hereinafter.

It is an object of the present invention to provide layers comprising phosphor microcrystal powder obtained by a process, which is neither complex nor time- and/or energy consuming, whereby said layers can be suitable used for highly demanding optical applications.

An object of the present invention is achieved in that a wavelength conversion layer with a matrix layer comprising embedded rare-earth-ion-doped micro crystallites and/or rare-earth-ion-doped amorphous particles, wherein said rare-earth-ion-doped micro crystallites and/or rare-earth-ion-doped amorphous particles are doped with at least one of the lanthanides, wherein said rare-earth-ion-doped micro crystallites and/or doped amorphous particles having a mean diameter $d_{50}$ of 10 nm to 500 µm, and wherein the matrix layer is transparent, whereby the refractive indices of said rare-earth-ion-doped micro crystallites and/or said rare-earth-ion-doped amorphous particles match the refractive indices of the matrix layer with a $\Delta n \geq 0$ and $\leq 0.1$ for at least one wavelength in the range of 400 nm to 1200 nm.

A layer of a thickness d that consists of a matrix material with a refractive index $n_1$ and with embedded crystals of a slightly different refractive index $n_2$ can be defined by the difference in the refractive indices $\Delta n$. The method to measure the refractive indices $\Delta n$ is described below.

However, it is most preferred, that the crystallites are embedded in a material of exactly the same refractive index in order to make them "invisible", i.e. to avoid any light scattering on the interfaces. The demand for perfect index matching in all spatial directions makes it preferable from the crystallites that they don't show any birefringence. Therefore it can be advantageous to choose a crystal with cubic symmetry.

Instead of said doped crystallites small particles of a doped amorphous material can be suitable used, e.g. Erbium doped fluoride glass. Also mixtures of crystallites and doped amorphous particles can be suitable used to be embedded in a matrix layer according to the present invention.

The upper outer surface of the matrix layer with embedded rare-earth-ion-doped micro crystallites and/or rare-earth-ion-doped amorphous particles can be plan, smooth or rough. Further, due to the method of manufacture at least a part of rare-earth-ion-doped micro crystallites and/or rare-earth-ion-doped amorphous particles embedded in the matrix can extend out of the matrix layer and into an intermediate layer. Thus, the intermediate layer can be most preferably used to completely cover crystallites, which may stick out of the matrix layer.

An advantage of the present invention is that high luminance can be achieved as well as lasers can be provided using at least one wavelength conversion layer according to the present invention. Another advantage of the present invention is that it can allow a very flexible shaping of the converting media, especially for wave-guiding layers. Further, wavelength conversion layer according to the present invention allows wavelength conversion without scattering.

A wavelength conversion layer according to the present invention may allow wavelength conversion of radiation in the range of 600 nm to 1200 nm into 400 nm to 650 nm (up conversion from IR to visible light). It may also allow wavelength conversion of radiation in the range of 350 nm to 500 nm to radiation in the range of 400 nm to 650 nm (down conversion from UV/blue to visible light).

According to the present invention it is preferred to use rare-earth doped micro-crystals embedded in a matrix material of glass and/or polymer. Moreover, the wavelength conversion layer can be easily manufactured in almost any shape.

The present invention relates in particular to micro crystallites and/or doped amorphous particles, wherein said rare-earth-ion-doped micro crystallites and/or doped amorphous particles having a mean diameter $d_{50}$ of 50 nm to 500 µm, preferably with a mean diameter $d_{50}$ of 100 nm to 30 µm and further preferred with a mean diameter $d_{50}$ of 1 µm to 10 µm.

The feature $d_{50}$ as used in the present invention has the meaning that at least 50% of the micro crystal falls in the defined range of diameter.

However, it can be beneficial that at least 20 wt.-%, preferably at least 50 wt.-%, further preferred at least 70 wt.-%, more preferred at least 80 wt.-% and most preferred at least 90 wt.-% of the matrix embedded doped micro crystallites and/or doped amorphous particles having a diameter in the range of from 100 nm to 10 µm.

According to the present invention a high luminance of a wavelength conversion layer and/or up-conversion laser can be obtained if a relative small amount of rare-earth-ion-doped micro crystallites and/or doped amorphous particles is used.

Thus, a matrix layer according to the present invention can comprise rare-earth-ion-doped micro crystallites and/or rare-earth-ion-doped amorphous particles with a volume fraction, based on the matrix layer, of 0.1 vol.-% to 50 vol.-%, preferably 0.5 vol.-% to 20 vol.-%, more preferred of 1 vol.-% to 15 vol.-% and most preferred of 5 vol.-% to 10 vol.-%, and/or with a weight fraction, based on the matrix layer, of 0.1 wt.-% to 50 wt.-%, preferably 0.5 wt.-% to 20 wt.-%, more preferred of 1 wt.-% to 15 wt.-% and most preferred of 5 wt.-% to 10 wt.-%.

The micro crystallites of rare earth ions useful for the present invention can be selected from the group comprising YLF, YAG, LiLuF$_4$, BaY$_2$F$_8$, SrF$_2$, LaCl$_3$, KPb$_2$Cl$_5$ and/or LaBr$_3$ Said micro crystallites, such as rare-earth doped YAG or YLF, can be produced relatively easy as powders with crystallites of the desired size such as 100 nm to 10 μm.

The amorphous particles useful for the present invention can be selected from the group comprising ZBLAN, germanate glasses, chalcogenite glasses, sulfide containing glasses, selenide containing glasses and/or telluride containing glasses.

Dopants, which can be used according to the present invention, can be selected from the group of rare earth ions, in particular lanthanides, such as erbium, praseodymium, thulium, holmium, samarium, europium, dysprosium, terbium, cerium, neodymium and/or ytterbium.

It can be preferred that the concentration of the dopants in the crystallites are in the range of 0.1-10 wt.-%, based on the total amount of crystallites. However co-doping with dopants, preferably with Ytterbium, in the range of 1 wt.-% to 30 wt.-%, can be advantageous in order to increase the IR absorption and/or to allow energy transfer on other suitable rare earth ions.

Further, in the case of excitation with blue, violet or ultraviolet radiation and down conversion to visible radiation YAG crystallites doped with holmium, samarium, europium, dysprosium, erbium and/or terbium can be used. Also, cerium may be used as single dopant or together with samarium. However, it can be beneficial to use the high absorption characteristics of cerium in order to transfer the excitation energy to the samarium.

A preferred micro crystallite material embedded in a matrix material, which can be used for the excitation with IR radiation and up conversion to visible radiation can be selected from the group comprising:

YLF, LiLuF$_4$, BaY$_2$F$_8$, SrF$_2$, LaCl$_3$, KPb$_2$Cl$_5$ or LaBr$_3$ crystallites doped with erbium, praseodymium, thulium, holmium or neodymium.

To further improve the luminance of a wavelength conversion layer according to the present invention it is preferred that the refractive indices of said rare-earth-ion-doped micro crystallites and/or rare-earth-ion-doped amorphous particles match the refractive indices of the matrix layer for the emission wavelength with a $\Delta n \geq 0$ and $\leq 0.01$, preferably $\leq 0.005$ and more preferably $\leq 0.001$ and/or wherein the refractive indices of said rare-earth-ion-doped micro crystallites and/or said rare-earth-ion-doped amorphous particles match the refractive indices of the matrix layer for the excitation wavelength with a $\Delta n \geq 0$ and $\leq 0.1$, preferably $\leq 0.05$ and more preferably $\leq 0.01$.

It is most preferred, that the amorphous matrix material match the refractive indices of the crystallites and/or matrix material as close as possible for the desired wavelengths, i.e. for the excitation wavelength and the emission wavelength. This can be of importance, since any scattering at the interfaces will destroy the high beam quality of a laser.

In an advantageous configuration of a waveguide laser the radiation is trapped in the waveguide. Any scattering of the excitation wavelength under small angles cause a small light loss from the waveguide and lowers the efficiency. Depending on the desired geometry and the numerical aperture of the waveguide the tolerable deviation of the refractive indices of said matrix with embedded rare-earth-ion-doped micro crystallites and/or doped amorphous particles can for each component be calculated, i.e. matrix material, doped micro crystallites as well as doped amorphous particles.

A wavelength conversion layer according to the present invention can preferably comprise a matrix layer having a melting point lower than the melting point of the rare-earth-ion-doped micro crystallites and/or of said rare-earth-ion-doped amorphous particles. A matrix layer melting point lower than the melting point of the rare-earth-ion-doped micro crystallites and/or of said rare-earth-ion-doped amorphous particles can be desired to avoid a detrimental effect to the crystals and amorphous particles, since there is a danger that particle size and form of crystals and amorphous particles can be altered by melting. Thus, the matrix material should have a softening point low enough in order not to destroy the crystallites, i.e. much lower than the melting point of the crystallites.

A matrix material, which can be suitable used according to the present invention, can be a polymer and/or glass material. Further, it can be preferred to use a flexible or elastic matrix material.

The above mentioned matrix material allows a simple shaping by thermal melt processing, spin coating, sol-gel deposition and other well known deposition techniques.

It is an advantage of the present invention that the wavelength conversion layer comprising embedded rare-earth-ion-doped micro crystallites and/or rare-earth-ion-doped amorphous particles can be easily shaped in practically each desired form.

However, it can be preferred that a wavelength conversion layer according to the present invention has a shape, wherein the ratio of thickness to length of said wavelength conversion layer is 1:100 to 1:100,000, preferably 1:1000 to 1:70,000 and more preferred 1:5,000 to 1:50,000.

A preferred wavelength conversion layer according to the present invention can comprise at least one outer surface of said matrix layer, i.e. preferably an outer upper and/or outer lower surface of said matrix layer, with embedded rare-earth-ion-doped micro crystallites and/or rare-earth-ion-doped amorphous particles, whereby said upper surface being coated with an intermediate layer free of embedded rare-earth-ion-doped micro crystallites and/or rare-earth-ion-doped amorphous particles, whereby the refractive indices of said intermediate layer match the refractive indices of said matrix layer with a $\Delta n \geq 0$ and $\leq 0.1$, preferably $\leq 0.01$, more preferably $\leq 0.005$, most preferably $\leq 0.001$ for wavelengths of 400 nm to 1200 nm. However, it is most preferred that the refractive indices of said intermediate layer and said matrix layer is identical. Further, the intermediate layer can be coated on top of the upper surface and lower surface of said matrix layer, i.e. the matrix layer can be sandwiched between at least two intermediate layers.

According to a preferred embodiment of the present invention a wavelength conversion layer may be formed so, that an upper outer surface and/or a lower outer surface of a matrix layer is coated with a cladding layer, whereby the material of said cladding layer is different to the material of the matrix layer, and whereby the cladding layer has a refractive indices lower than the refractive index of said adjacent matrix layer.

It is most preferred that the cladding layer is free of said crystallites contained in the matrix layer. Crystallites that may stick out of the matrix layer can be covered with an intermediate.

According to a further preferred embodiment of the present invention a wavelength conversion layer may be formed so, that an upper outer surface of said intermediate layer is coated with a cladding layer and/or wherein a lower outer surface of said matrix layer is coated with a cladding layer, whereby the material of said cladding layer is different to the material of the intermediate layer and/or matrix layer, and whereby the cladding layer has a refractive index lower than the refractive indices of said adjacent intermediate layer and/or matrix layer.

A preferred embodiment is the arrangement of at least one wavelength conversion layer according to the present invention as a thin layer on a substrate in front of high power diode laser bars. The production of such layers having a thickness of few micrometers may require additional measures to provide a smooth interface to the cladding. The deposition of an intermediate layer of the same matrix material, but without crystallites, on top of the matrix layer may be necessary. Also, the refractive index of the cladding layer should be lower than that of the matrix layer and intermediate layer.

However, it is also suitable to use a wavelength conversion layer according to the present invention that differs in that it does not comprise an intermediate layer, whereby at least one wavelength conversion layer is arranged as a thin layer on a substrate in front of high power diode laser bars. The production of such layers having a thickness of few micrometers may require additional measures to provide a smooth interface to the cladding. The refractive index of the cladding layer should be lower than that of the matrix layer.

According to the present invention at least one matrix layer, intermediate layer and/or cladding layer of a wavelength conversion layer according to the present invention has a shape, wherein the ratio of thickness to length of said matrix layer, intermediate layer and/or cladding layer is 1:100 to 1:100,000, preferably 1:1000 to 1:70,000 and more preferred 1:5,000 to 1:50,000.

However it can be preferred that:
a matrix layer has a thickness of 1 μm to 200 μm; and/or
a intermediate layer has a thickness of 500 nm to 5 μm; and/or
a cladding layer has a thickness of 10 μm to 1000 μm.

The present invention is further illustrated by the FIGS. 1 to 6.

Figure 2:
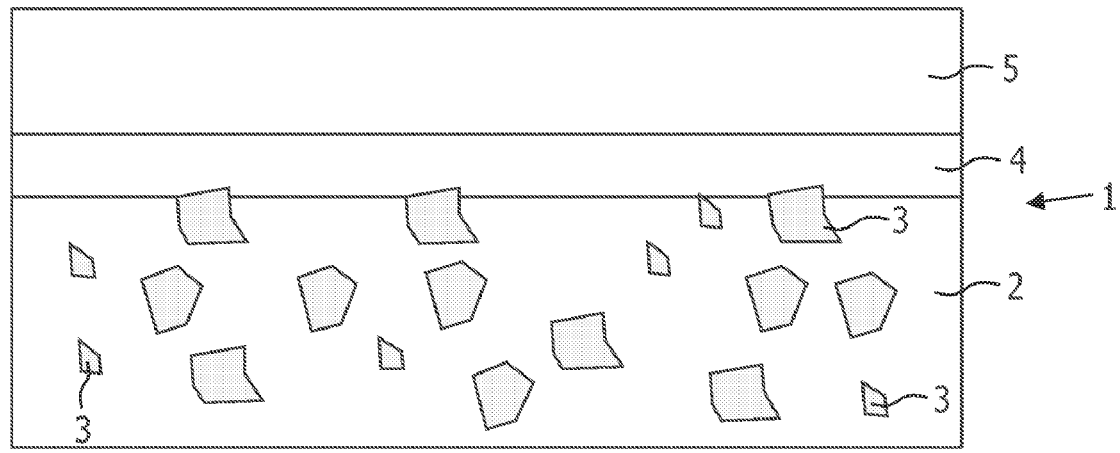
Figure 3:
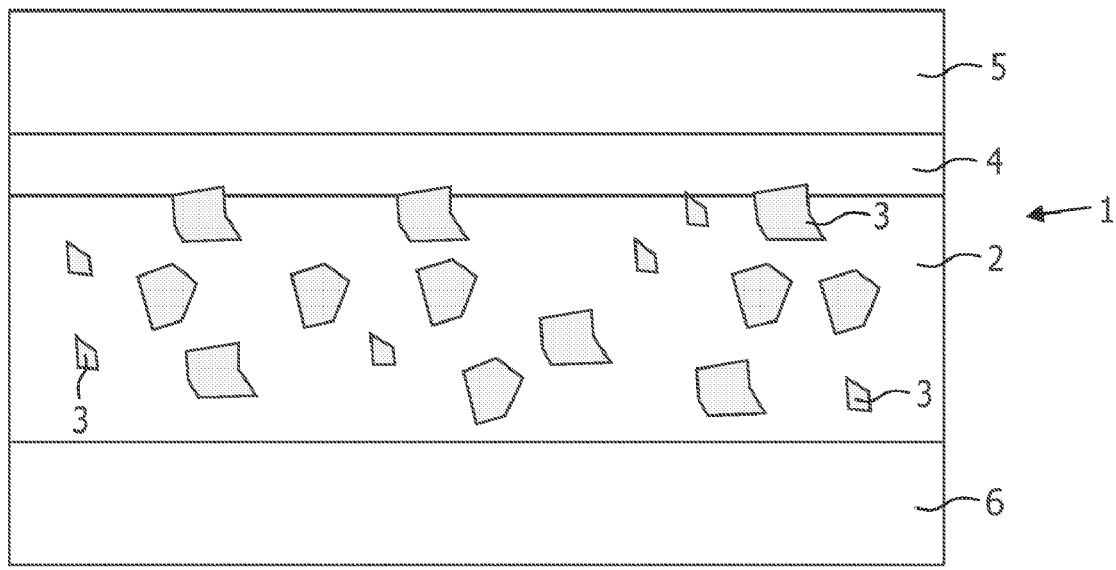
Figure 4:
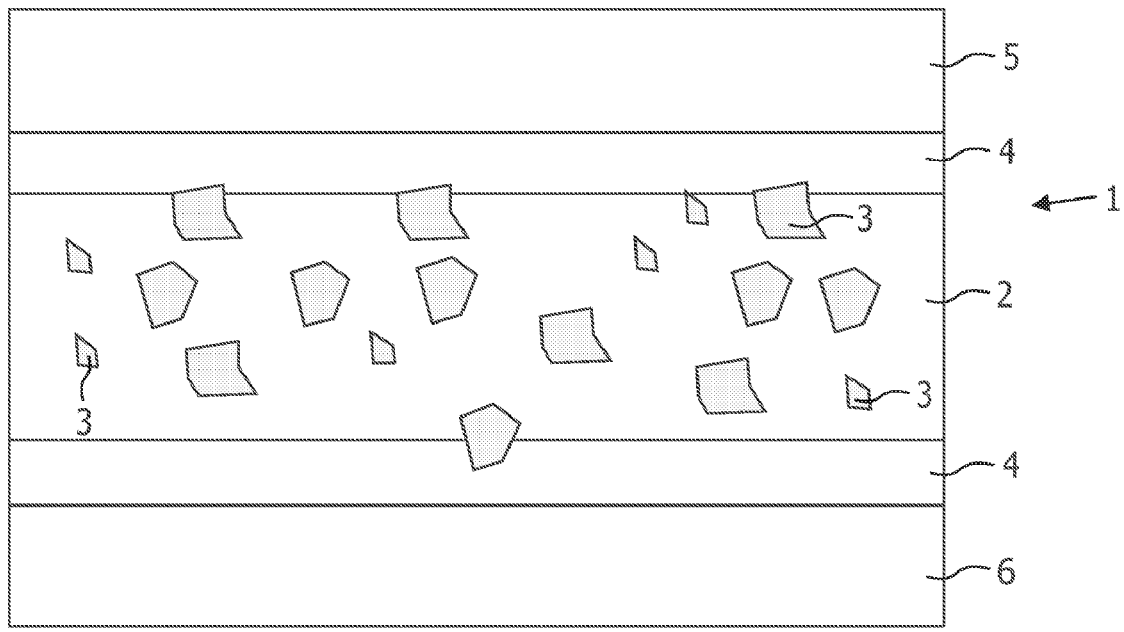
Figure 5:
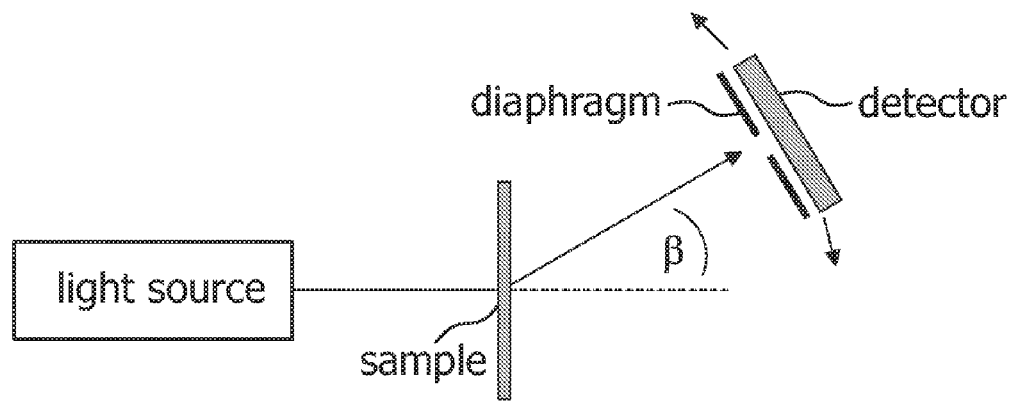
Figure 6:
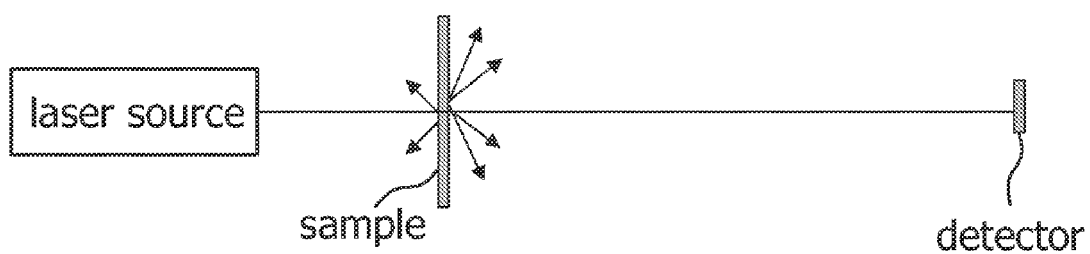

FIG. 1 lateral view of a wavelength conversion layer with matrix layer and intermediate layer;

FIG. 2 lateral view of a wavelength conversion layer with matrix layer, intermediate layer and cladding layer;

FIG. 3 lateral view of a wavelength conversion layer with matrix layer, intermediate layer and first and second cladding layer;

FIG. 4 lateral view of a wavelength conversion layer with matrix layer sandwiched between two intermediate layers and first and second cladding layer;

FIG. 5 arrangement to measure the scattering profile;

FIG. 6 measurement setup.

FIG. 1 shows a lateral view of a wavelength conversion layer 1 with matrix layer 2 with embedded rare-earth-ion-doped micro crystallites 3, whereby micro crystallites partly extend into the intermediate layer 4, which is arranged on top of the upper outer surface of the matrix layer 2. The material of the intermediate layer 4 is Schott glass N-LASF41, available from Schott Glas AG. The thickness of the intermediate layer is 1 μm. The matrix layer 2 comprises 1 vol.-% micro crystallites of Ce:YAG, based on the total volume of the matrix. The micro crystallites of Ce:YAG are doped with 1 at.-% based on $Y^{3+}$, i.e. 1% of the $Y^{3+}$ ions are replaced by $Ce^{3+}$. The mean diameter $d_{50}$ of the crystals is 5 μm. The matrix material is Schott glass N-LASF41, available from Schott Glas AG, having a refractive index at 450 nm (excitation wavelength) of 1.860 and a refractive index at 550 nm (emission wavelength) of 1.840.

The refractive index of Ce:YAG is 1.853 at 450 nm and 1.833 at 550 nm.

The thickness of the matrix layer with the embedded crystals is 20 μm.

FIG. 2 shows a lateral view of a wavelength conversion layer 1 according to FIG. 1, whereby on top of the upper outer surface of the intermediate layer 4 a first cladding layer 5 is arranged. This cladding layer 5 is chosen to be Schott glass N-LASF44, available from Schott Glas AG, having refractive indices of 1.826 at 450 nm and 1.808 at 550 nm. The thickness of the cladding layer is 100 μm.

FIG. 3 shows a lateral view of a wavelength conversion layer 1 according to FIG. 2, whereby on top of the lower outer surface of the matrix layer 2 a second cladding layer 6 is arranged. This cladding layer is chosen to be Schott glass N-LAF21, available from Schott Glas AG, refractive indices of 1.809 at 450 nm and 1.792 at 550 nm. The thickness of the cladding layer is 200 μm.

FIG. 4 shows a lateral view of a wavelength conversion layer 1 according to FIG. 3, whereby the matrix layer 2 is sandwiched between two intermediate layers 4. The material of the intermediate layer 4 is Schott glass N-LASF41, available from Schott Glas AG. The thickness of the intermediate layer is 1 μm.

Method to measure refractive indices Δn

A layer of a thickness d that consists of a matrix material with a refractive index $n_1$ and doped with crystals of a slightly different refractive index $n_2$ can be defined by the difference in the refractive indices Δn. This difference in refractive indices Δn can be determined in the following way for small differences Δn: For crystal sizes of ≧30 μm a measure of the difference in refractive indices is the angular distribution of the scattered light when shining light through a sample of thickness d. The FWHM (full width at half maximum) of this angular distribution is proportional to the product of the sample thickness d, the volume fraction of the crystals V and the difference in refractive indices Δn divided by the mean crystal size $d_{50}$, i.e.

$$FWHM = \frac{3}{2} \cdot \frac{d \cdot V}{d_{50}} \cdot \Delta n$$

A detector that can make an angular scan around the sample, see FIG. 5 measures the scattering profile, i.e. intensity as a function of the scattering angle β. The light source can be a halogen lamp with an appropriate colour filter or a laser. A diaphragm before the detector can adjust the angular resolution (see FIG. 5: measuring the scattering profile, i.e. angular scan).

The relationship of the FWHM also imposes a maximum length of a practical device of given materials. For a given difference of the refractive indices of the matrix material and the first cladding layer, usually expressed as the numerical aperture, the length of the device of a given mean crystal size, refractive index difference Δn between the matrix material and the crystal doping material and a given volume fraction should not be much longer than the length leading to a FWHM of the angular distribution of the light in the matrix layer that is twice as large as the critical angle for total internal reflection in the matrix layer.

For crystal sizes smaller than 30 μm, the formula becomes inaccurate, for very small crystal sizes it leads to completely wrong results. For crystal sizes smaller than 30 μm the above model based on geometrical optics is no longer able to explain the light transmission properties correctly. An exact treatment can be done by means of the Mie-theory. For small differences in the refractive indices Δn an approximation known as Rayleigh-Gans-scattering can be used (see e.g. H. C. v. d .Hulst, Light scattering by small particles, Dover Publications, New York, 1982).

In this approximation the difference in refractive indices Δn can be determined from a measurement of the real in-line transmission. This is a measurement of the transparency of a sample in which the fraction of light is measured that is not scattered or absorbed during transmission. The measurement setup is shown in FIG. 6. The acceptance angle of the detector should be smaller than 0.5° to allow practically only light that is not scattered in the sample (or scattered at less than 0.5°) to reach the detector (see FIG. 6: measurement setup to determine the real in-line transmission).

The real in-line transmission I is determined by the extinction coefficient γ and the sample thickness d:

$$I = I_0 \cdot e^{-\gamma d},$$

wherein $I_0$ is the intensity in front of the sample. The extinction coefficient is given when the approximations for Rayleigh-Gans-scattering are fulfilled as $$\gamma = 6 \cdot V \cdot \frac{\pi^2 r}{\lambda_0^2} \cdot \Delta n^2.$$

As before V is the volume fraction of the crystals in the sample. $\lambda_0$ is the wavelength used in the measurement in air. Using this relationship the difference in refractive indices can be determined from the measurement of the real in-line transmission.

A wavelength conversion layer according to present invention can be suitable used for the manufacture of semiconductor light sources, such as LED, OLED and/or laser, whereby the laser is preferably selected from the group comprising IR-laser, blue-laser and UV-laser.

Most preferred is the use of at least one wavelength conversion layer according to present invention for a blue-violet GaN based LED.

Further, wavelength conversion layer according to present invention can be used for upconversion laser, wherein a wavelength conversion layer is excited by radiation of IR diode lasers and the resulting radiation is coupled into the waveguide. Upconversion layer may be used with a conversion layer according to the present invention are described for example in EP-A1 0 310 2678, which is fully incorporated by reference.

Another object of the present invention is directed to a system, for example an apparatus, containing at least one semiconductor light source according to the present invention being used in one or more of the following applications:

laser lamp,
LED lamp,
OLED lamp,
shop lighting,
home lighting,
head lamps
accent lighting,
spot lighting,
theatre lighting,
office lighting
illumination of workplaces
automotive front lighting
automotive auxiliary lighting
automotive interior lighting
consumer TV applications,
fibre-optics applications, and
projection systems.

To provide a comprehensive disclosure without unduly lengthening the specification, applicant hereby incorporates by reference each of the patents and patent applications referenced above.

The particular combinations of elements and features in the above detailed embodiments are exemplary only; the interchanging and substitution of these teachings with other teachings in this and the incorporated-by-reference patents/applications are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Further, reference signs used in the description and claims do not limit the scope of the invention as claimed.

The invention claimed is:

1. A wavelength conversion layer with a matrix layer comprising embedded rare-earth-ion-doped micro crystallites or rare-earth-ion-doped amorphous particles, wherein said rare-earth-ion-doped micro crystallites or rare-earth-ion-doped amorphous particles are doped with at least one of the lanthanides, wherein said rare-earth-ion-doped micro crystallites or doped amorphous particles have a mean diameter $d_{50}$ of 10 nm to 500 μm, and wherein the matrix layer is transparent, whereby the refractive indices of said rare-earth-ion-doped micro crystallites or said rare-earth-ion-doped amorphous particles match the refractive indices of the matrix layer with a $\Delta n \geqq 0$ and $\leqq 0.1$ for at least one wavelength in the range of 400 nm to 1200 nm.

2. The wavelength conversion layer according to claim 1, wherein the matrix layer comprises said rare-earth-ion-doped micro crystallites or rare-earth-ion-doped amorphous particles with a volume fraction, based on the matrix layer, of 0.1 vol.-% to 50 vol.-%.

3. The wavelength conversion layer according to claim 1, wherein the crystallites of rare earth ions are selected from the group consisting of YLF, YAG, $LiLuF_4$, $BaY_2F_8$, $SrF_2$, $LaCl_3$, $KPb_2Cl_5$ and $LaBr_3$, wherein the crystallites of rare earth ions exhibit a cubic symmetry.

4. The wavelength conversion layer according to claim 1, wherein the refractive indices of said rare-earth-ion-doped micro crystallites or rare-earth-ion-doped amorphous particles match the refractive indices of the matrix layer for the emission wavelength with $\Delta n \geqq 0$ and $\leqq 0.01$ or the refractive indices of said rare-earth-ion-doped micro crystallites or rare-earth-ion-doped amorphous particles match the refractive indices of the matrix layer for the excitation wavelength with a $\Delta n \geqq 0$ and $\leqq 0.1$.

5. The wavelength conversion layer according to claim 1, wherein the matrix layer has a melting point lower than the melting point of the rare-earth-ion-doped micro crystallites or rare-earth-ion-doped amorphous particles.

6. The wavelength conversion layer according to claim 1, wherein the ratio of thickness to length of said wavelength conversion layer is 1:100 to 1:100,000.

7. The wavelength conversion layer according to claim 1, wherein at least one outer surface of said matrix layer comprises embedded rare-earth-ion-doped micro crystallites or rare-earth-ion-doped amorphous particles and is coated with an intermediate layer free of embedded rare-earth-ion-doped micro crystallites or rare-earth-ion-doped amorphous particles, wherein said matrix layer is sandwiched between said intermediate layers, whereby the refractive indices of said intermediate layer match the refractive indices of said matrix layer with a Δn≧0 and ≦0.1 and at most the refractive indices of the material of said intermediate layer and said matrix layer is identical.

8. The wavelength conversion layer according to claim 1, wherein an outer surface of said intermediate layer or said matrix layer is coated with a cladding layer or wherein a lower outer surface of said matrix layer is coated with a cladding layer, whereby the material of said cladding layer is different from the material of the intermediate layer or matrix layer, and whereby the cladding layer has a refractive index lower than the refractive indices of said adjacent intermediate layer or matrix layer.

9. A semiconductor light source selected from the group consiting of LED, OLED, UV and laser, whereby the laser is selected from the group consisting of IR-laser, blue-laser and UV-laser, further comprising at least one wavelength conversion layer according to claim 1.

10. A system containing at least one semiconductor light source according to claim 9, wherein the semiconductor light source is used in one or more of applications selected from the group consisting of:

a laser lamp,
a LED lamp,
a OLED lamp,
shop lighting,
home lighting,
head lamps
accent lighting,
spot lighting,
theatre lighting,
office lighting,
illumination of a workplace,
automotive front lighting,
automotive auxiliary lighting,
automotive interior lighting,
consumer TV applications,
fibre-optics applications, and
projection systems.

\* \* \* \* \*